United States Patent [19]

Arimoto

[11] Patent Number: 5,182,229
[45] Date of Patent: Jan. 26, 1993

[54] METHOD FOR DIFFUSING AN N TYPE IMPURITY FROM A SOLID PHASE SOURCE INTO A III-V COMPOUND SEMICONDUCTOR

[75] Inventor: Satoshi Arimoto, Itami, Japan

[73] Assignee: Mitsubishi Denki Kabushiki Kaisha, Tokyo, Japan

[21] Appl. No.: 798,740

[22] Filed: Nov. 27, 1991

[30] Foreign Application Priority Data

Nov. 28, 1990 [JP] Japan .................. 2-335830

[51] Int. Cl.[5] .......................... H01L 21/225
[52] U.S. Cl. ........................ 437/162; 437/959; 437/987; 148/DIG. 160
[58] Field of Search ............. 437/5, 110, 160, 161, 437/162, 934, 959, 987, 232; 148/DIG. 1, DIG. 65, DIG. 123, DIG. 160

[56] References Cited

U.S. PATENT DOCUMENTS

| | | | |
|---|---|---|---|
| 4,344,980 | 8/1982 | Yoder | 437/162 |
| 4,350,541 | 9/1982 | Mizushima et al. | 437/162 |
| 4,830,983 | 5/1989 | Thornton | 437/987 |
| 5,013,684 | 5/1991 | Epler et al. | 437/987 |
| 5,051,786 | 9/1991 | Nicollian et al. | 357/2 |

OTHER PUBLICATIONS

"Semiconductor Laser With Controllably Disordered Superlattice Includes Selenium-Doped Semiconductor Laser In Predetermined Pattern", Discrete Devices, 8923 p. 33, U12.

Primary Examiner—Brian E. Hearn
Assistant Examiner—C. Chaudhari
Attorney, Agent, or Firm—Leydig, Voit & Mayer

[57] ABSTRACT

A method for diffusing n type impurities from a solid phase source into a III-V compound semiconductor includes depositing an amorphous or polycrystalline selenium or sulfur film on the III-V compound semiconductor and diffusing selenium or sulfur from the film into the compound semiconductor by annealing. Highly controllable diffusion of n type impurities in a high concentration is achieved.

16 Claims, 2 Drawing Sheets

METHOD FOR DIFFUSING AN N TYPE IMPURITY FROM A SOLID PHASE SOURCE INTO A III-V COMPOUND SEMICONDUCTOR

FIELD OF THE INVENTION

The present invention relates to a method of diffusing an n type impurity into a III-V compound semiconductor and, more particularly, to a method of simply diffusing an n type impurity from a solid phase source in a high concentration and with high controllability.

BACKGROUND OF THE INVENTION

While fabricating semiconductor lasers or other electronic devices, it is required to diffuse n type impurities into group III-V compound semiconductors. Conventionally, silicon is generally used as an n type impurity to be diffused into group III-V compound semiconductors. However, diffusing silicon into a semiconductor in a large quantity causes technical difficulties in many cases.

On the other hand, in fabricating AlGaAs series semiconductor lasers, a technique of diffusing an impurity from a solid phase source, i.e. using a selenium doped semiconductor layer as a diffusion source has been developed for disordering a superlattice layer.

FIGS. 3(a) and 3(b) show a method for disordering a superlattice structure comprising AlGaAs series material as the group III-V compound semiconductor by diffusing selenium, which is disclosed in Japanese Published Patent Application 1-143285. In FIGS. 3(a) and 3(b), a first AlGaAs layer 4 is disposed on a GaAs substrate 11 and a superlattice layer 7 comprising AlGaAs/GaAs is disposed on AlGaAs layer 4. A second AlGaAs layer 9 is disposed on superlattice layer 7 and a selenium doped GaAs layer 2 is disposed on AlGaAs layer 9. A selenium diffusion region 10 is produced in the layers 9, 7 and 4 and the diffusion region 8 in the superlattice layer 7 becomes disordered.

A description is given of the diffusion process.

First of all, a first AlGaAs layer 4, a superlattice layer 7 comprising AlGaAs/GaAs, and a second AlGaAs layer 9 are successively epitaxially grown on GaAs substrate 11 by liquid phase epitaxy (LPE) or metal organic chemical vapor deposition (MOCVD) and further a GaAs layer 2 containing selenium and doped to an order of $10^{18}cm^{-3}$ is epitaxially grown on second AlGaAs layer 9 by a similar method. Thereafter, the selenium doped GaAs layer 2 is patterned by etching, leaving regions that require diffusion of impurities as shown in FIG. 3(a). The sample in this state is inserted into a quartz tube together with arsenic and an annealing is carried out. Arsenic is included in the quartz tube to prevent deterioration of material due to dissociation of As from the GaAs crystal by applying As pressure to the sample. For example, by carrying out annealing for about 14 hours at 850° C., diffusion of selenium to about a 1 micron depth from the selenium doped GaAs layer 2 takes place and regions 10 where selenium is diffused are produced as shown in FIG. 3(b). These regions are n type and superlattice layer 7 is disordered by the diffusion of selenium.

The prior art method of diffusing selenium from a solid phase source into group III-V compound semiconductors utilizes a selenium doped semiconductors layer as a diffusion source. In this method, however, the semiconductor layer serving as a diffusion source is required to be epitaxially grown, lattice-matching with the semiconductor layer on which the source is grown. Further the amount of selenium diffused depends on the kind and the growth condition of the semiconductor layer. The amount of selenium in the layer serving as a diffusion source is likely to be limited. This limitation makes it difficult to carry out diffusion or makes it impossible to disorder the superlattice when the amount of selenium is insufficient.

For example, doping of selenium into InP series material is difficult and solid-phase diffusion of selenium utilizing the above-described method can not be realized in InP series material.

As other examples of the n type diffusion using selenium according to the prior art, there are those recited in Japanese Patent Publication Nos. 60-24580 and 60-3772.

In these prior arts, amorphous chalcogenide layers including Se are used as a diffusion source. Therefore, there arises no problem in lattice-mismatching. However, these layers require quite complicated processes for producing a patterned diffusion source film. Disposing an Ag layer on the chalcogenide layer, diffusing Ag into the chalcogenide layer in a patterned configuration, removing a portion of Ag and the chalcogenide layer to leave the pattern, and covering the pattern with a heat resistant layer are required.

SUMMARY OF THE INVENTION

It is an object of the present invention to provide a method of diffusing an n type impurity from a solid phase source into a group III-V compound semiconductor that can be carried out easily as well as controllably.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with the present invention, a selenium film or a sulfur film in an amorphous or polycrystalline state is produced on a group III-V compound semiconductor and annealing is carried out to diffuse the selenium or sulfur into the semiconductor layer. Since an amorphous film or a polycrystalline film of Se or S which are group VI elements is used as an n type impurity diffusion source, the diffusion of n type impurity into group III-V compound semiconductor can be easily realized with high controllability and with a high dopant concentration.

DETAILED DESCRIPTION OF THE PREFERRED EMBODIMENTS

An embodiment of the present invention will be described in detail with reference to the drawings.

Figure 1A:
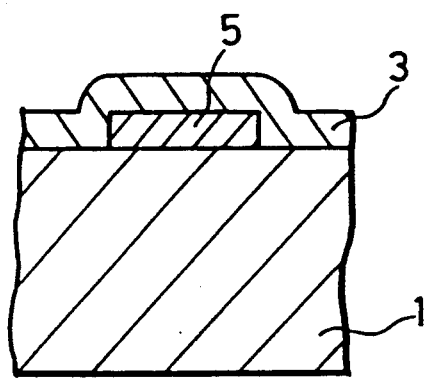
FIGS. 1(a) and 1(b) are cross-sectional views illustrating a method for diffusing an n type impurity from a solid phase source in accordance with an embodiment of the present invention.
Figure 1B:
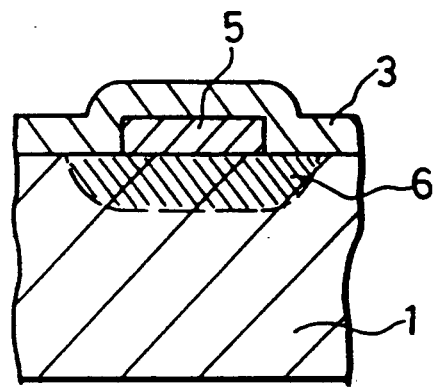

FIGS. 1(a) 1(b) show a method for diffusing an n type impurity from solid phase source in accordance with an embodiment of the present invention. In FIGS. 1(a) and 1(b) numeral 1 designates a group III-V compound semiconductor such as a GaAs substrate. An amorphous or polycrystalline selenium or sulfur film 5 is disposed on the group III-V compound semiconductor material 1 and a protection film 3 is disposed on the entire surface of the wafer.

A description is given of the diffusion process of this embodiment.

First of all, an amorphous or polycrystalline selenium or sulfur film 5 of about 0.1 micron thickness is produced on a GaAs substrate 1 as an impurity diffusion source. As a method for producing the selenium film 5 serving as a diffusion source, the substrate 1 is heated to about 200° to 300° C. in a reaction tube of a pressure of 2 to 3 Torr. $H_2Se$ gas introduced into the reaction tube is decomposed by a high frequency glow discharge at 13.56 MHz, thereby producing an amorphous selenium film on the substrate 1. The thus obtained selenium film 5 is patterned in a desired configuration and thereafter the protection film 3 such as $SiO_2$ or SiN, is deposited on the entire surface of wafer by chemical vapor deposition (hereinafter referred to as CVD) or sputtering. The thus obtained sample shown in FIG. 1(a) is raised in temperature to a range of 500° to 950° C. in an inactive gas ambient such as $H_2$ or $N_2$ and thereafter an annealing is carried out to obtain an n type impurity diffusion region 6 as shown in FIG. 1(b). Here, the protection film 3 prevents selenium from dissociating into the ambient from the selenium film 5 during the annealing to enhance diffusion efficiency and prevent atoms such as As from dissociating from the substrate. Because the protection film is not sufficient to prevent decomposition of the substrate when the annealing temperature is high, annealing is carried out under an As pressure. Control of the depth of the diffusion is carried out by controlling the annealing temperature and the annealing time appropriately. The present invention is essentially different from the method of diffusing selenium from a solid phase source described in the prior art in that an amorphous film 5 of selenium is used as a diffusion source. In this method, the amorphous film 5 has no lattice miss-match with the semiconductor layer into which the selenium is diffused. Further, since selenium is easily diffused into group III-V compound semiconductors compared to silicon, a high concentration of an, n type impurity can be diffused according to the invention. Furthermore, since amorphous or polycrystalline selenium is used as diffusion source in this embodiment, it is quite easy to produce a diffusion source in a desired pattern.

While in the above illustrated embodiment the conductivity type of the substrate is not particularly specified, an n type region can be produced in a p type substrate and an n+ type (high concentration n type) diffusion region can be produced in an n type substrate.

Figure 2A:
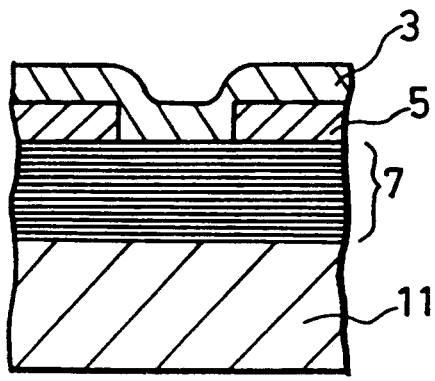
FIGS. 2(a) and 2(b) are cross-sectional views illustrating a method for diffusing an n type impurity from a solid phase source in accordance with another embodiment of the present invention.
Figure 2B:
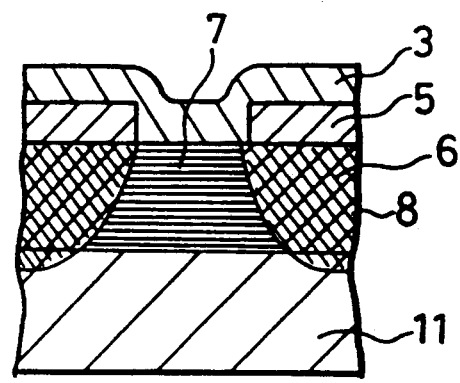
Figure 3A:
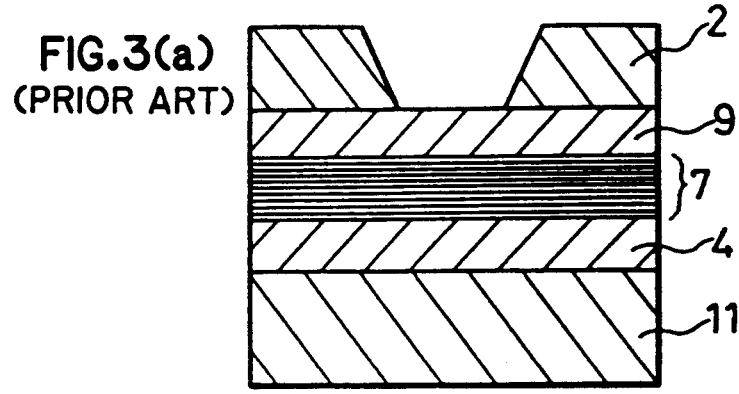
FIGS. 3(a) and 3(b) are cross-sectional views showing a prior art method for diffusing an n type impurity.
Figure 3B:
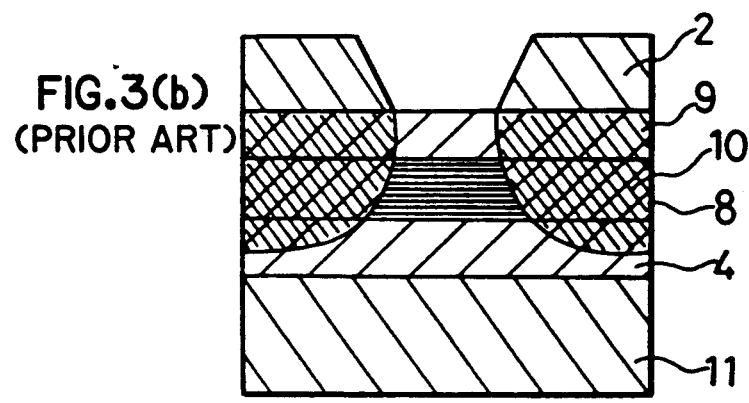

FIGS. 2(a) and 2(b) illustrate a process flow according to a second embodiment of the present invention in which a superlattice layer comprising group III-V compound semiconductor is disordered. In FIGS. 2(a) and 2(b), numeral 11 designates a GaAs substrate. A superlattice layer 7 comprising AlGaAs/GaAs is disposed on substrate 11. An amorphous or polycrystalline selenium film 5 is disposed on the superlattice layer 7 and a protection film 3 covers the selenium film 5 and the wafer.

When the superlattice 7 is to be partially disordered, an amorphous selenium film 5 or the like is produced on the superlattice 7 by vapor deposition or sputtering. An opening is produced in the amorphous selenium film 5 by photolithography and etching and a protection film 3 is deposited on the entire surface as shown in FIG. 2(a). By annealing this sample under the conditions described above with reference to the embodiment of FIGS. 1(a) and 1(b) diffusion of selenium is carried out only directly below the amorphous selenium film 5, thereby producing selenium diffusion regions 6. Here, those regions 8 in the superlattice layer 7 where selenium is diffused are disordered. This technique of disordering can be employed in the production of all optical devices and electronic devices utilizing the superlattices.

While in the above illustrated embodiment selenium is used as a diffusion source, sulfur which is also a group VI element can also be used.

In the above illustrated embodiment an n type impurity is diffused into GaAs but the present invention can be applied to group III-V compound semiconductor such as InAs, AlAs, InP, GaP, AlP, GaSb, InSb, and AlSb and all ternary compound, quaternary compound, and quinary compound mixed crystals comprising these materials.

As is evident from the foregoing description, according to the present invention, an amorphous or polycrystalline selenium or sulfur film, which is a group VI element film, is used as a solid phase source of an n type impurity diffused into a group III-V compound semiconductor. Therefore, a highly controllable diffusion of an n type impurity can be carried out to produce a high dopant impurity concentration.

What is claimed is:

1. A method for diffusing an n type impurity into a III-V compound semiconductor comprising:
    depositing a film consisting of amorphous or polycrystalline selenium directly on and in contact with a III-V compound semiconductor;
    depositing a protection film selected from the group consisting of $SiO_2$ and silicon nitride directly on said amorphous or polycrystalline film of selenium; and
    diffusing selenium from said amorphous or polycrystalline film into said III-V compound semiconductor by annealing.

2. A method as defined in claim 1 wherein said III-V compound semiconductor is GaAs.

3. A method as defined in claim 1 wherein said selenium film has a thickness of about 0.1 micron.

4. A method as defined in claim 1 including depositing said amorphous or polycrystalline selenium film in a high frequency glow discharge.

5. A method as defined in claim 1 wherein said film of selenium is patterned to a desired configuration and said protection film is deposited by one of CVD and sputtering.

6. A method as defined in claim 1 including annealing the semiconductor at a temperature in a range of 500° to 950° C. in an inactive gas ambient.

7. A method as defined in claim 1 wherein the compound semiconductor includes a superlattice including disordering at least part of the superlattice by diffusing selenium into the superlattice.

8. A method as defined in claim 7 wherein said superlattice comprises AlGaAs and GaAs layers.

9. A method for diffusing an n type impurity into a III-V compound semiconductor comprising:
   depositing a film consisting of amorphous or polycrystalline sulfur directly on and in contact with a III-V compound semiconductor;
   depositing a protection film selected from the group consisting of SiO$_2$ and silicon nitride directly on said amorphous or polycrystalline film of sulfur; and
   diffusing sulfur from said amorphous or polycrystalline film into said III-V compound semiconductor by annealing.

10. A method as defined in claim 9 wherein said III-V compound semiconductor is GaAs.

11. A method as defined in claim 9 wherein said sulfur film has a thickness of about 0.1 micron.

12. A method as defined in claim 9 including depositing said amorphous or polycrystalline sulfur film in a high frequency glow discharge.

13. A method as defined in claim 9 wherein said film of sulfur is patterned to a desired configuration and said protection film is deposited by one of CVD and sputtering.

14. A method as defined in claim 9 including annealing the semiconductor at a temperature in a range of 500° to 950° C. in an inactive gas ambient.

15. A method as defined in claim 9 wherein the compound semiconductor includes a superlattice including disordering at least part of the superlattice by diffusing sulfur into the superlattice.

16. A method as defined in claim 15 wherein said superlattice comprises AlGaAs and GaAs layers.

* * * * *